US009349594B1

(12) United States Patent
Cheng et al.

(10) Patent No.: US 9,349,594 B1
(45) Date of Patent: May 24, 2016

(54) NON-PLANAR SEMICONDUCTOR DEVICE WITH ASPECT RATIO TRAPPING

(71) Applicant: International Business Machines Corporation, Armonk, NY (US)

(72) Inventors: Kangguo Cheng, Schenectady, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/533,360

(22) Filed: Nov. 5, 2014

(51) Int. Cl.
*H01L 21/02* (2006.01)
*H01L 29/06* (2006.01)
*H01L 27/088* (2006.01)
*H01L 21/84* (2006.01)

(52) U.S. Cl.
CPC ...... *H01L 21/0259* (2013.01); *H01L 21/02381* (2013.01); *H01L 21/02488* (2013.01); *H01L 21/02494* (2013.01); *H01L 21/02532* (2013.01); *H01L 21/02538* (2013.01); *H01L 21/845* (2013.01); *H01L 27/0886* (2013.01); *H01L 29/0653* (2013.01)

(58) Field of Classification Search
CPC combination set(s) only.
See application file for complete search history.

(56) References Cited

U.S. PATENT DOCUMENTS

| 8,173,551 | B2 | 5/2012 | Bai et al. |
| 8,324,660 | B2 | 12/2012 | Lochtefeld et al. |
| 2008/0070355 | A1 | 3/2008 | Lochtefeld et al. |
| 2008/0286949 | A1* | 11/2008 | Atanackovic ........... C30B 23/02 438/481 |
| 2010/0065925 | A1* | 3/2010 | Huang .............. H01L 29/42376 257/410 |
| 2010/0072515 | A1 | 3/2010 | Park et al. |
| 2011/0210374 | A1 | 9/2011 | Lochtefeld |
| 2012/0032234 | A1 | 2/2012 | Wang et al. |
| 2012/0199876 | A1 | 8/2012 | Bai et al. |
| 2013/0099282 | A1* | 4/2013 | Chen ................. H01L 29/66795 257/190 |

OTHER PUBLICATIONS

Li et al., "Defect reduction of GaAs epitaxy on Si (001) using selective aspect ratio traping", Applied Physics Letters 91, 021114 (2007), doi: 10.1063/1.2756165, AIP Publishing.
Li et al., "Thin Film InP Epitaxy on Si (001) Using Selective Aspect Ratio Trapping", 2009, ECS Transactions, 18 (1) pp. 887-894, 10.1149/1.3096551 ©The Electrochemical Society.

(Continued)

*Primary Examiner* — Jerome Jackson, Jr.
*Assistant Examiner* — Charles R Peters
(74) *Attorney, Agent, or Firm* — Olivia R. Scheuer

(57) ABSTRACT

As disclosed herein, a semiconductor device with aspect ratio trapping is provided, including a bulk substrate, a plurality of isolation pillars formed on the bulk substrate, wherein one or more gaps are formed between the isolation pillars, an oxide layer formed by epitaxy on the bulk substrate, between the isolation pillars, wherein the oxide layer partially fills the gaps between the isolation pillars, one or more fins formed over the oxide layer between the isolation pillars, such that the one or more fins fill the gaps between the isolation pillars, wherein the oxide layer electrically isolates the one or more fins from the bulk substrate. The oxide layer has an aspect ratio that is selected to substantially eliminate defects at the interface between the oxide layer and the fins. The semiconductor device may also include a semiconductor layer between the bulk substrate and oxide layer.

6 Claims, 8 Drawing Sheets

(56) References Cited

OTHER PUBLICATIONS

Merckling, et al., "Selective area growth of InP in shallow trench isolation on large scale Si(001) wafer using defect confinement technique", 2013, pp. 033708-1 to 033708-6, Journal of Applied Physics 114, 033708 (2013), doi: 10.1063/1.4815959, AIP Publishing.

Paladugu et al., "Site Selective Integration of III-V Materials on Si for Nanoscale Logic and Photonic Devices", Crystal Growth & Design, 12(10), pp. 4696-4702 (2012), © 2012 American Chemical Society, dx.doi.org/10.1021/ cg300779v, ACS Publications.

Van Dal, et al., "Germanium p-Channel FinFET Fabricated by Aspect Ratio Trapping", IEEE Transactions on Electron Devices, vol. 61, No. 2, Feb. 2014, pp. 430-436, © 2014 IEEE.

Wu et al., "Atomic-layer-deposited $Al_2O_3$ /GaAs metal-oxide-semiconductor field-effect transistor on Si substrate using aspect ratio trapping technique", Applied Physics Letters 93, pp. 242106-1 to 242106-3 (2008), doi: 10.1063/1.3050466, AIP Publishing.

\* cited by examiner

NON-PLANAR SEMICONDUCTOR DEVICE WITH ASPECT RATIO TRAPPING

BACKGROUND OF THE INVENTION

The present invention relates generally to the field of semiconductor devices, and more particularly to non-planar semiconductor devices.

As electronic components become smaller, control over electron flow across an integrated circuit is diminished. The current complimentary metal-oxide semiconductor (CMOS) technology roadmap calls for the size of integrated circuit components to be cut in half every two years. To maintain this roadmap, non-planar architectures have been developed including the use of trigates and finFETs. While new CMOS architectures have proven to be efficient, challenges still exist in integrating 3-dimensional elements onto an integrated circuit chip.

SUMMARY

As disclosed herein, a semiconductor device with aspect ratio trapping includes a bulk substrate, a plurality of isolation pillars formed on the bulk substrate, wherein one or more gaps are formed between the isolation pillars, an oxide layer formed by epitaxy on the bulk substrate, between the isolation pillars, wherein the oxide layer partially fills the gaps between the isolation pillars, one or more fins formed over the oxide layer between the isolation pillars, such that the one or more fins fill the gaps between the isolation pillars and wherein the oxide layer electrically isolates the one or more fins from the bulk substrate. The oxide layer has an aspect ratio that is selected to substantially eliminate defects at the interface between the oxide layer and the fins. The semiconductor device may also include a semiconductor layer between the bulk substrate and oxide layer. A method of fabricating the same is also disclosed.

DETAILED DESCRIPTION

As integrated circuit (IC) components decrease in size, new technologies must be developed to ensure component requirements are maintained. One issue that has become prevalent in IC component design is current leakage across transistors. Current leakage can occur when electrons are able to jump from defect to defect within a device. To minimize the leakage, non-planar devices—such as trigates or finFETs—can be implemented. Furthermore, the embodiments disclosed herein recognize that by minimizing defects within and adjacent to the current conducting regions of such devices, current leakage can be reduced.

Aspect ratio trapping (ART) is one method that can be implemented to trap defects, caused by the lattice mismatch of materials, to the region near the interface between the materials. ART is a method of engineering the width and depth of cavities—wherein a material is to be epitaxially grown—such that defects that propagate to a surface of epitaxially grown layer are minimized. Consequently, ART engineering may restrict defects in the epitaxially grown lattice to the bottom portion of the lattice, as opposed to being dispersed throughout the depth of the lattice. By trapping those defects to non-conductive regions of such devices, current leakage is minimized.

Figure 1:
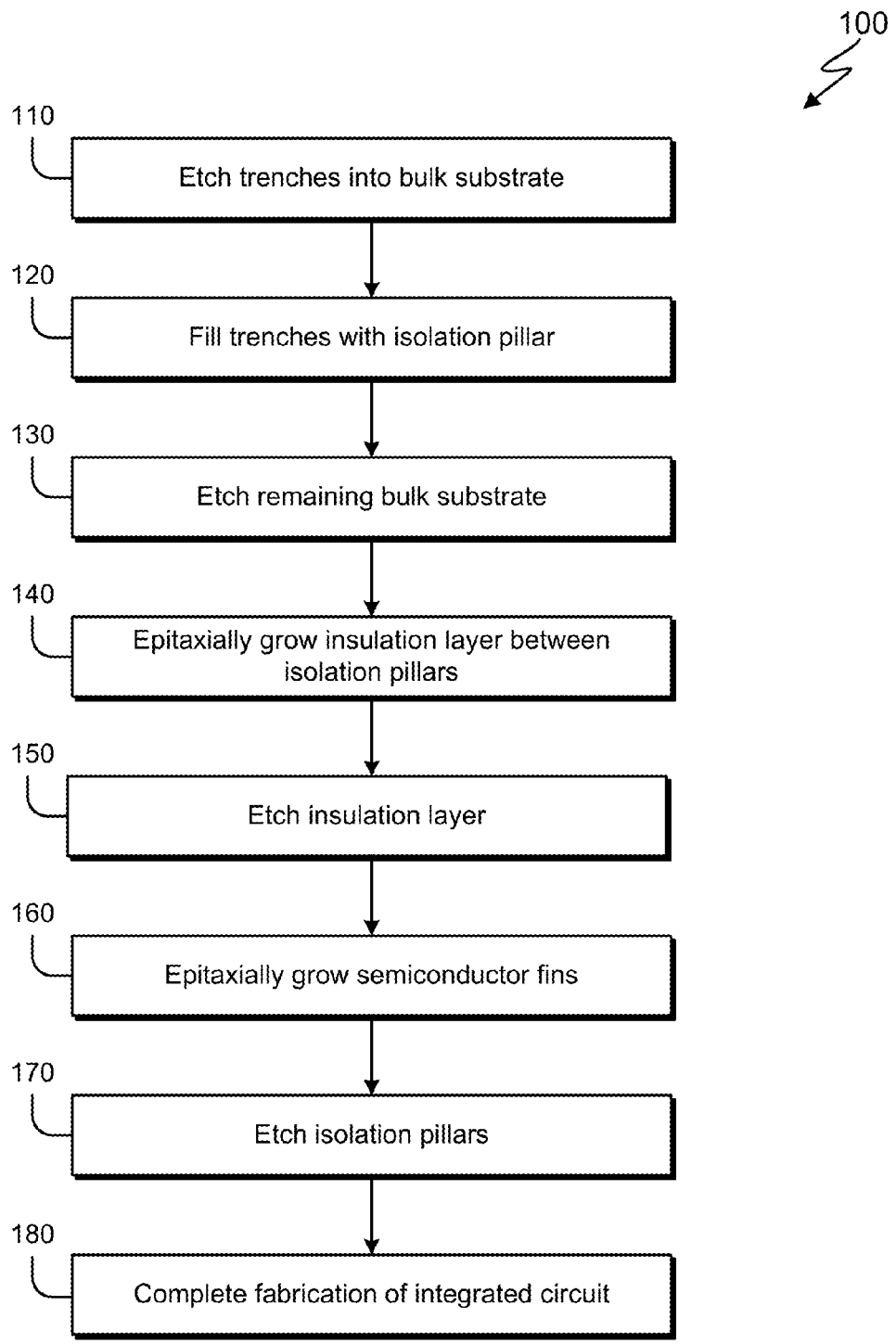
FIG. 1 is a flowchart depicting one embodiment of a non-planar semiconductor device fabrication method.

FIG. 1 is a flowchart depicting one embodiment of a non-planar semiconductor device fabrication method 100. As depicted, the non-planar semiconductor device fabrication method 100 includes etching (110) trenches into a bulk substrate, filling (120) the trenches with an insulator material creating isolation pillars, etching (130) the bulk substrate remaining between the isolation pillars, growing (140) an engineered lattice epitaxial oxide layer between the isolation pillars, etching (150) the oxide layer to a point below the isolation pillars, epitaxially growing (160) semiconductor fins on top of oxide layer, and etching (170) the isolation pillars, revealing the upper portion of the semiconductor fins. Creating a non-planar semiconductor using the non-planar semiconductor device fabrication method 100 traps lattice mismatch defects in the lower portion of the engineered lattice epitaxial oxide layer and thereby decreases leakage across the fabricated devices.

The depicted method may be used to form transistors onto a bulk substrate, for use in an integrated circuit. The non-planar semiconductor device fabrication method 100 begins by etching (110) trenches into a bulk substrate. The etching may be executed by several existing material etching processes, including reactive-ion etching.

Multiple fins can be created on the same substrate by filling (120) the trenches with an insulator material. The insulator material in the trenches may be $SiO_2$. The $SiO_2$ may act as an isolation pillar between fins on the non-planar semiconductor.

Gaps between the isolation pillars may be formed by etching (130) the bulk substrate that remains between the isolation pillars. The base of the fin is formed by growing (140) an engineered lattice epitaxial oxide layer between the isolation pillars. Through the use of aspect ratio trapping the oxide layer may prevent or reduce current leakage through the semiconductor device. The height of the oxide layer is controlled by etching (150) the oxide layer to a point below the top of the isolation pillars.

The source and/or drain of the non-planar semiconductor is created by epitaxially growing (160) semiconductor fins on the oxide layer, between the isolation pillars. By etching (170) the isolation pillars, the upper portion of the fin is exposed. The method may proceed by continuing (180) with a standard CMOS process flow, including implementing a gate over the semiconductor fins.

Figure 2A:
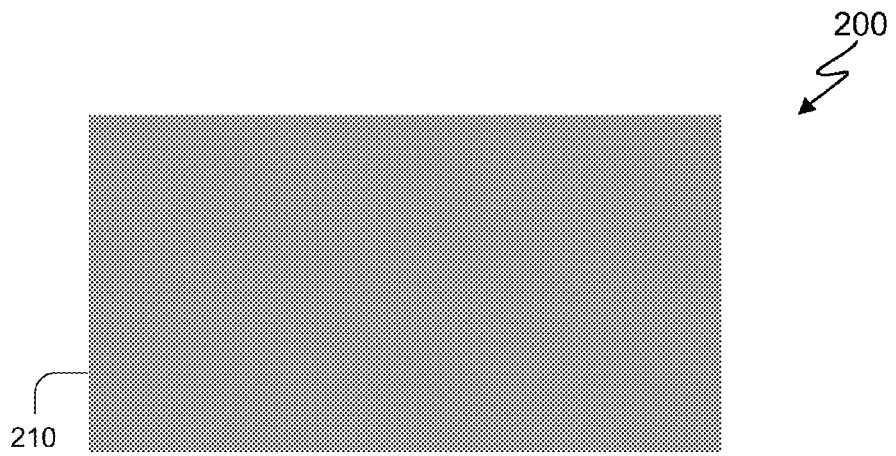
FIGS. 2A-I depict a cross-section of one embodiment of a non-planar semiconductor device at various stages of the fabrication method of FIG. 1.
Figure 2B:
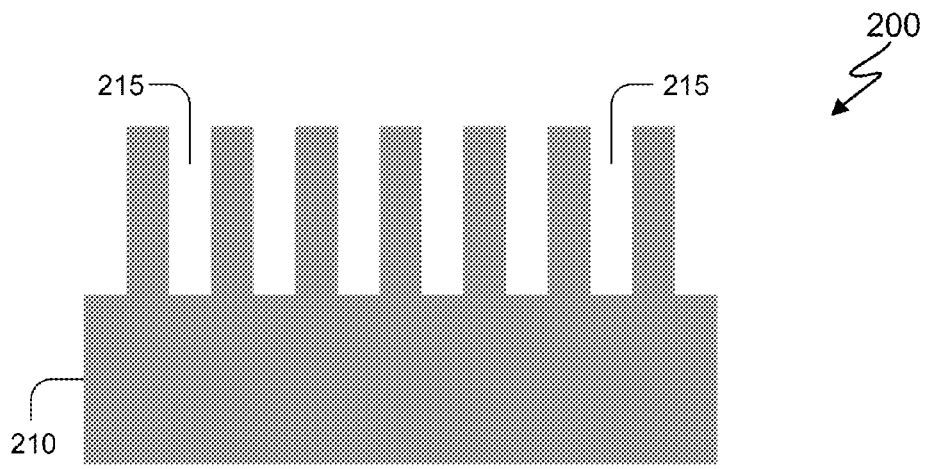
Figure 2C:
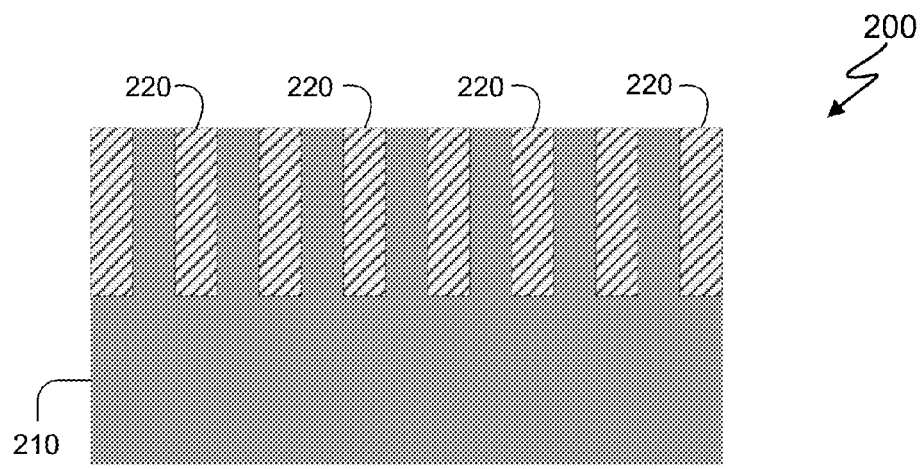
Figure 2D:
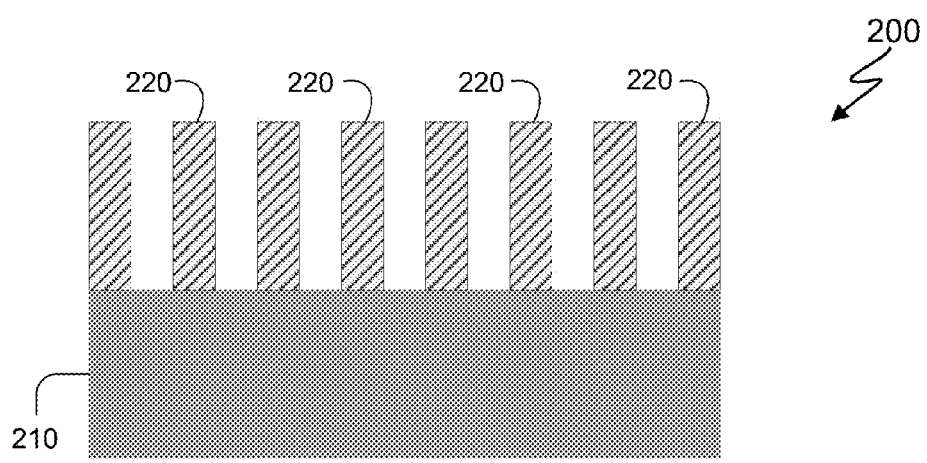
Figure 2E:
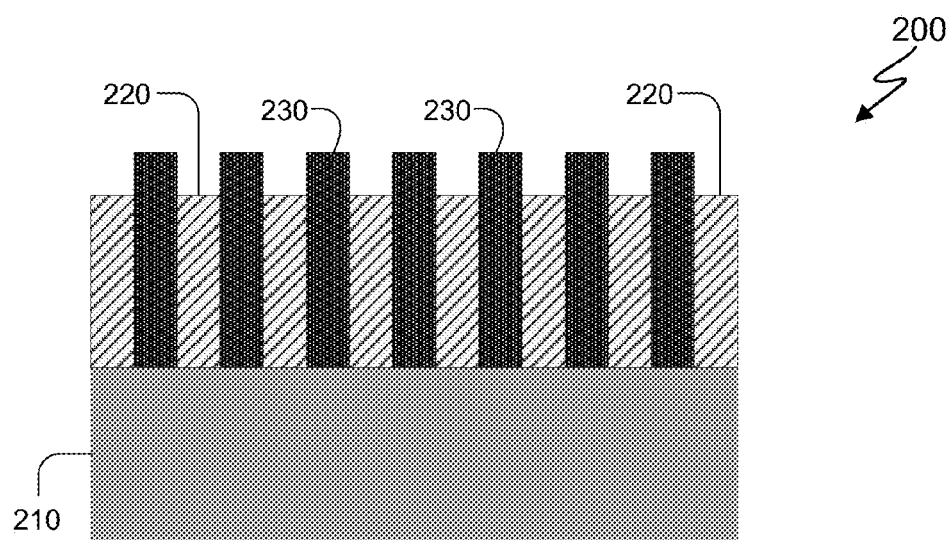
Figure 2F:
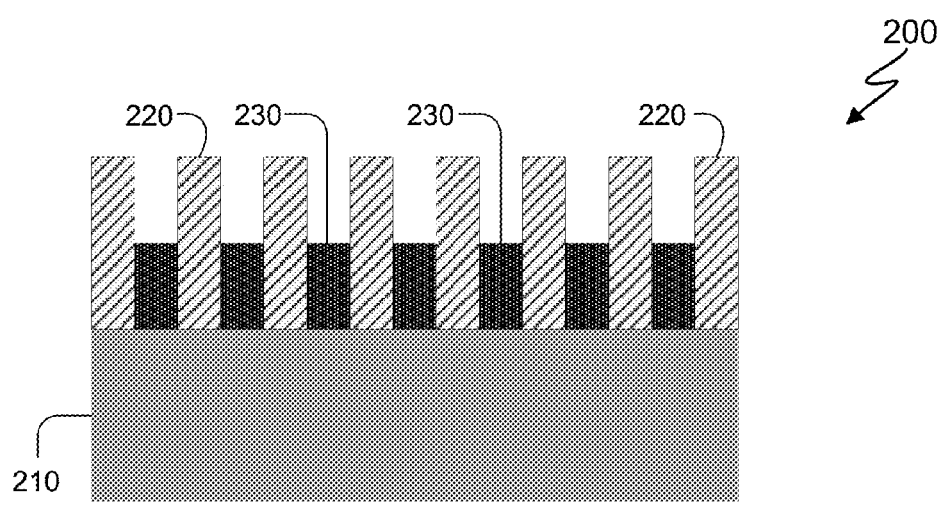
Figure 2G:
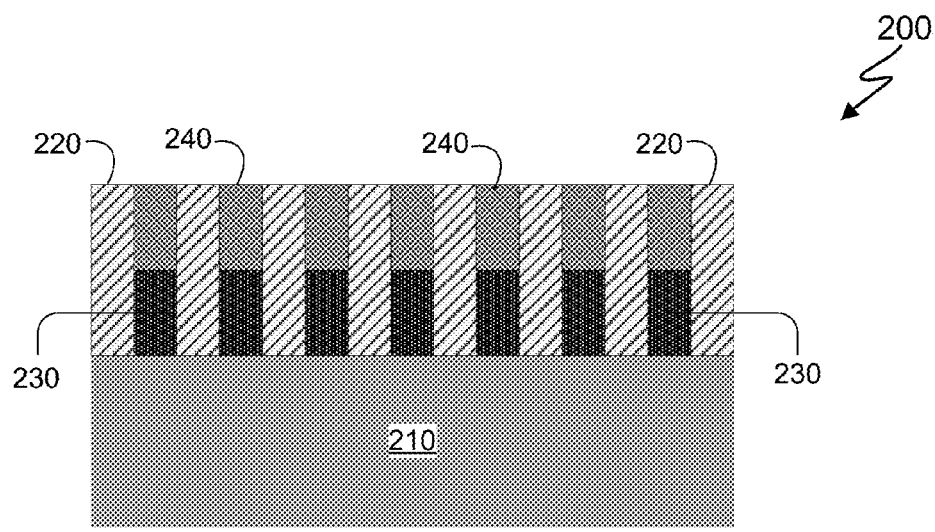
Figure 2H:
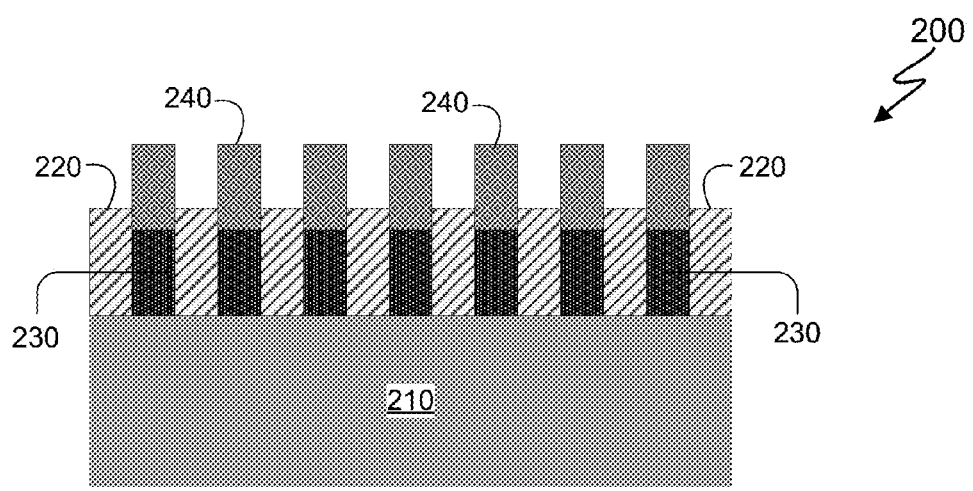
Figure 2I:
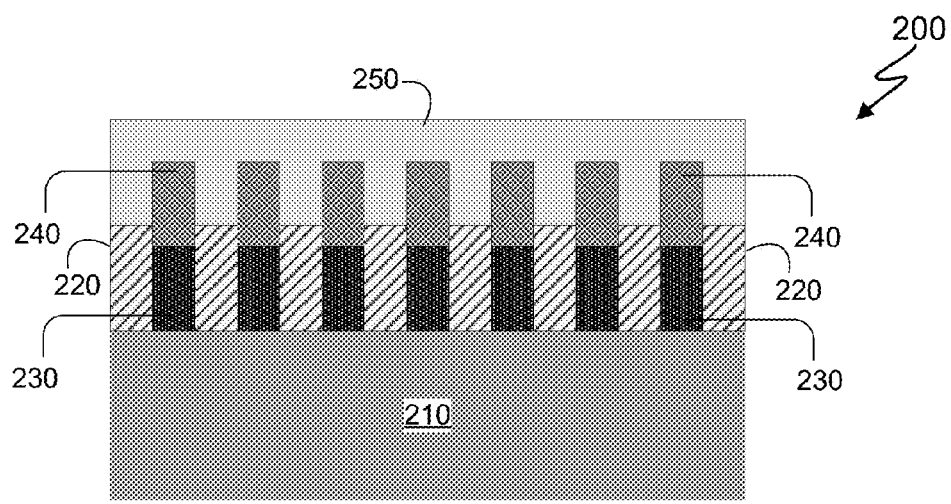
Figure 2J:
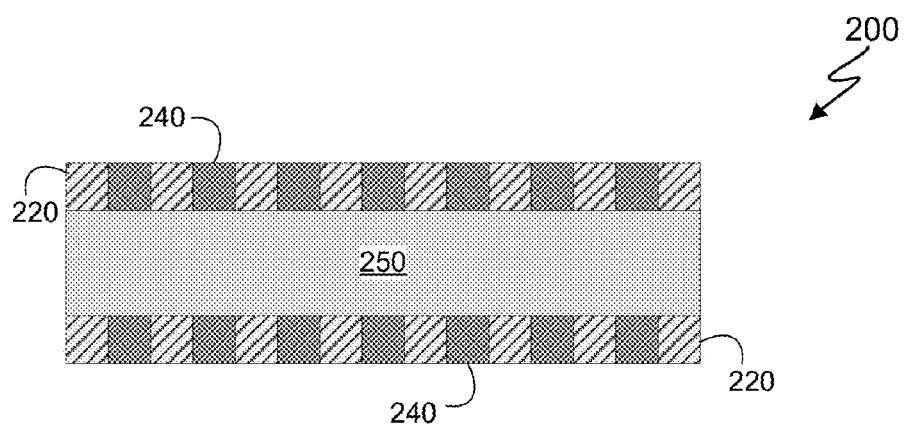
FIG. 2J depicts a top-down view of one embodiment of a non-planar semiconductor device at one stage of the non-planar semiconductor device fabrication method 100.
Figure 3:
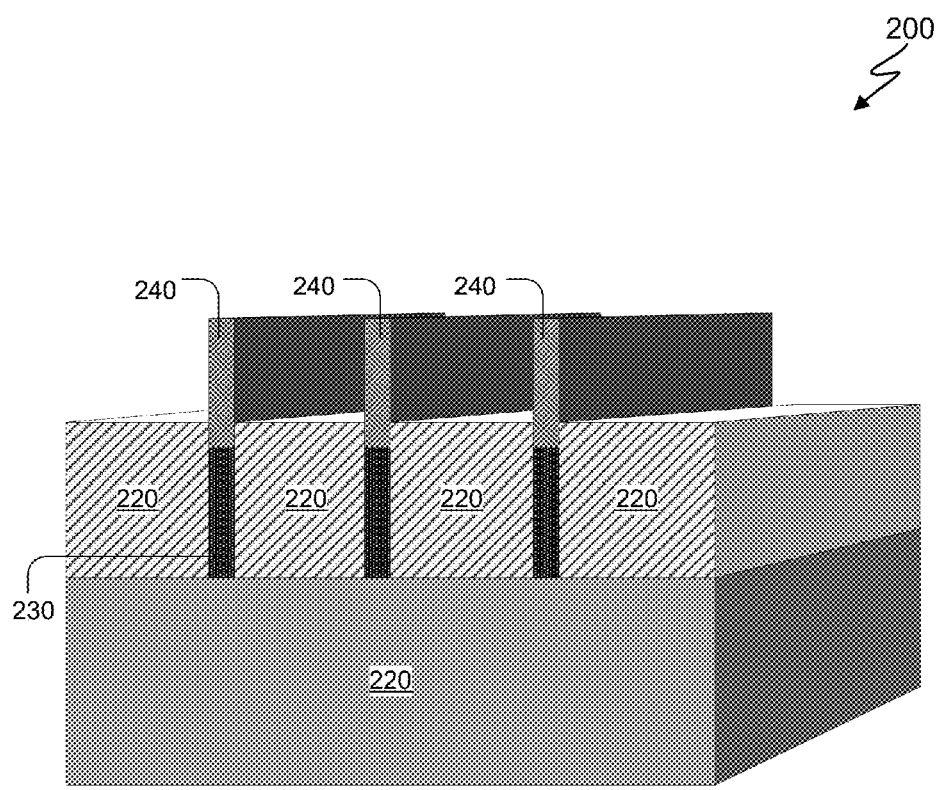
FIG. 3 is a perspective view depicting one embodiment of a non-planar semiconductor device made through the fabrication method of FIG. 1.
Figure 4:
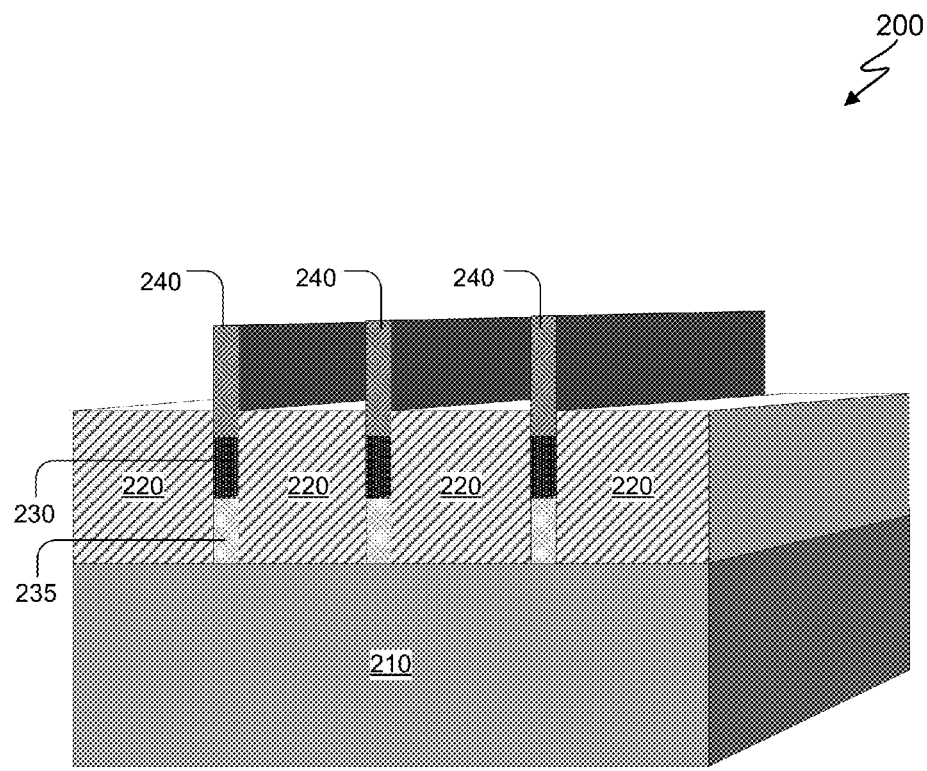
FIG. 4 is a perspective view depicting an alternative embodiment of a non-planar semiconductor device.

The method as described above may be used in the fabrication of integrated circuit chips, for example those depicted in FIGS. 2-4.

FIGS. 2A-I depict a cross-sectional view and FIG. 2J depicts a top-down view of one embodiment of a non-planar semiconductor device at various stages of the non-planar semiconductor device fabrication method 100. The depicted embodiment of the non-planar semiconductor device 200 includes bulk substrate 210, trenches 215, isolation pillars 220, lattice engineered epitaxial oxide 230, fins 240, gate 250, and bottom aspect-ratio-trapped (ART) semiconductor layer 235 (as shown in FIG. 4). The depicted sequence shows the fabrication of a non-planar semiconductor device with aspect ratio trapping.

In the depicted embodiment, as shown in FIG. 2A, the fabrication process begins with a bulk substrate 210. In the depicted embodiment, the bulk substrate 210 is comprised of silicon; however, bulk substrate 210 can also be comprised of Ge, InP, or other similar materials. The thickness of bulk substrate 210 can vary from about 0.5-1.5 mm.

As shown in FIG. 2B, trenches 215 can be etched into the bulk substrate 210 using a reactive ion etching process. A hard mask is placed over portions of the bulk substrate 210, which shield the covered portion from the etching process. The hard mask may be made of nitrides, oxides, oxinitrides, or a combination of these materials. The masks may be placed such that the trenches 215 are 5 nm to 40 nm in width. The depth of the trench 215 is adjusted by controlling the etching time of the etch materials on the bulk substrate 210. In one embodiment, the depth of the trench 215 is between 50 nm and 200 nm. Due to natural variances in etching speed, the depth of each trench 215 may vary by several nanometers.

In one embodiment, as shown in FIG. 2C, the trenches 215 may be filled with an insulating material including $SiO_2$. The use of the insulation material is to create shallow trench isolation. The insulation material may prevent or reduce electrical current leakage between fins 240, when finFET device 200 comprises a plurality of fins. The insulating material may be deposited using plasma enhanced chemical vapor deposition, low-temperature chemical vapor deposition, high-temperature chemical vapor deposition, flowable oxide or other similar deposition methods.

The hard masks placed over bulk substrate 210 may be removed using processes known to those skilled in the art. The bulk substrate 210 may then be etched, using a reactive ion or wet etch process, to create gaps between each of the isolation pillars 220. The etching process is selective, such that the isolation pillars 220 are not adversely affected by the process. The depth of the bulk substrate 210 etch may be adjusted by controlling the contact time of the etch materials on the bulk substrate 210. Due to natural variances in etching speed, the height of gaps may vary by several nanometers. One embodiment of the selective etch is shown in FIG. 2D; while the height of each isolation pillar and each gap is uniform in the depicted figure, there is no requirement that the depth of the trenches 215 or gaps be precisely uniform.

The width and depth of the gaps may be selected to substantially eliminate or reduce defects in the oxide layer 230— or semiconductor layer 235 as described below—caused by lattice mismatch between the bulk substrate 210 and epitaxial growth of the oxide layer 230. For example, a statistical analysis or predictive model—where the defect rate is a function of the aspect ratio—can be utilized to determine an aspect ratio that will trap defects in the oxide layer at a desired distance from the top of the layer. The desired distance may be one where the current leakage from the fin 240 to the oxide layer 230 is substantially eliminated or reduced. Defects in the oxide layer 230 can increase current leakage into the bulk substrate 210. By minimizing the number of defects in oxide layer 230, the current leakage across the non-planar semiconductor device 200 can be minimized.

As shown in FIG. 2E, an oxide layer 230 is formed above the bulk substrate 210 between the isolation pillars 220. The oxide layer 230 may be a lattice engineered epitaxial oxide. The oxide layer 230 may been engineered such that minimal lattice mismatch occurs in the epitaxial growth due to the aspect ratio of the gap, decreasing the number of defects created during epitaxial growth. The greatest number of defects may occur where the bulk substrate 210 and oxide layer 230 meet; i.e. the defects that do occur during the epitaxial growth of the oxide layer 230 will tend to be trapped toward the bottom, nearest the bulk substrate 210. Trapping the defects at the bottom of the oxide layer 230 further decreases current leakage across non-planar semiconductor device 200. The oxide layer 230 may be made of a material such as $La_{1-x}Y_xO_y$; for example, in one embodiment the chemical formula for the oxide layer 230 is $(La_{1-x}Y_x)_2O_3$. However, the oxide layer 230 may be made of several rare-earth oxides including $Y_2O_3$, $Pr_2O_3$, or $CeO_2$.

The oxide layer 230 may undergo chemical mechanical polishing (CMP), to smooth the upper portion of the layer and minimize height differentials between sections of the layer. The CMP process may be followed by etching the oxide layer 230. In one embodiment, as shown in FIG. 2F, the oxide layer 230 is etched such that the height of the isolation pillars 220 is greater than the height of the oxide layer 230. A wet or dry etching process may be used, and is time controlled. As depicted, etching the oxide layer 230 may leave spaces between the upper portions of the isolation pillars 220.

In another embodiment, a semiconductor layer 235 is grown on the bulk substrate 210 prior to the growth of the oxide layer 230. Semiconductor layer 235 may also undergo aspect ratio trapping, to minimize defects in the lattice. The semiconductor layer may be grown through epitaxy and may be made of SiGe, Ge, or any other III-V materials. A finFET device 200 that includes semiconductor layer 235 is depicted in FIG. 4. In an embodiment that includes the semiconductor layer 235, the semiconductor layer 235 may undergo a CMP process and an etching process. Etching the semiconductor layer 235 may leave cavities between the upper portions of the isolation pillars 220. The process may then continue as described, with the growth of the oxide layer 230.

A fin 240 may be formed on the oxide layer 230, as shown in FIG. 2G. The fins 240 may be made of Ge, strained-Si, or other III-V materials. The fins may be grown epitaxially from the oxide layer 230, to form a crystalline structure.

The isolation pillars 220 may be etched, as shown in FIG. 2H, to reveal at least the upper portion of the fin 240. While the depicted embodiment shows all of the isolation pillars at the same height, the isolation pillar 220 may be etched to a point below, in-line, or above the top of oxide layer 230; however, for best results, the etch should not reach the defects in the oxide layer 230.

Once the fins 240 are created, the process can continue with standard CMOS flow. A gate 250 can be created using either a gate first or gate last method. A front view of the finFET device 200 including a gate is depicted in FIG. 2I; whereas, a top view of the finFET device 200 with a gate is depicted in FIG. 2J.

FIG. 3 depicts a perspective view of the non-planar semiconductor device 200. Additionally, a second embodiment of the non-planar semiconductor device 200 that includes the semiconductor layer 235, is depicted in FIG. 4. As discussed above, a gate may be added to the non-planar semiconductor device 200 after the non-planar semiconductor device fabrication method 100 is completed.

In certain embodiments, the method as described above is used in the fabrication of integrated circuit chips. The fabrication steps described above may be included on a semiconductor substrate consisting of many devices and one or more wiring levels to form an integrated circuit chip.

The resulting integrated circuit chip(s) can be distributed by the fabricator in raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher level carrier) or in a multichip package (such as a ceramic carrier that has either or both surface interconnections or buried interconnections). In any case, the chip may be then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should be noted that this description is not intended to limit the invention. On the contrary, the embodiments presented are intended to cover some of the alternatives, modifications, and equivalents, which are included in the spirit and scope of the invention as defined by the appended claims. Further, in the detailed description of the disclosed embodiments, numerous specific details are set forth in order to provide a comprehensive understanding of the claimed invention. However, one skilled in the art would understand that various embodiments may be practiced without such specific details.

Although the features and elements of the embodiments disclosed herein are described in particular combinations, each feature or element can be used alone without the other features and elements of the embodiments, or in various combinations with or without other features and elements. This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A non-planar semiconductor device with aspect ratio trapping comprising:
    a bulk substrate;
    a plurality of isolation pillars formed on the bulk substrate, wherein one or more gaps are formed between the isolation pillars;
    an oxide layer, comprised of a $La_{1-x}Y_xO_y$ material, formed by epitaxy on the bulk substrate, between the isolation pillars, wherein the oxide layer partially fills the gaps between the isolation pillars, and wherein the oxide layer comprises a gradient of defects, and wherein the gradient of defects is concentrated at an interface of the bulk substrate and the oxide layer, wherein x is greater than zero;
    one or more fins formed over the oxide layer between the isolation pillars, such that the one or more fins fill the gaps between the isolation pillars, wherein the oxide layer electrically isolates the one or more fins from the bulk substrate; and
    wherein the oxide layer has an aspect ratio that is selected to substantially eliminate defects at the interface between the oxide layer and the fins.

2. The non-planar semiconductor device of claim 1, wherein the bulk substrate comprises silicon.

3. The non-planar semiconductor device of claim 1, wherein the isolation pillars comprise $SiO_2$.

4. The non-planar semiconductor device of claim 1, wherein a semiconductor layer is epitaxially grown on the bulk substrate, between the isolation pillars, such that the semiconductor layer is formed between the bulk substrate and oxide layer.

5. The non-planar semiconductor device of claim 4, wherein the semiconductor layer is comprised of a III-V material.

6. The non-planar semiconductor device of claim 1, wherein the fin is comprised of Ge or strained-Si.

* * * * *